United States Patent [19]

Burkin et al.

[11] 4,014,092
[45] Mar. 29, 1977

[54] METHOD FOR MAKING MEMORY PLANE FOR MAGNETIC DECODER

[76] Inventors: Jury Alexandrovich Burkin, Tsvetnoi proezd, 29, kv. 24; Jury Valentinovich Metlyaev, ulitsa Ilicha, 5, kv. 40, both of Novosibirsk, U.S.S.R.

[22] Filed: Nov. 25, 1975

[21] Appl. No.: 635,104

[52] U.S. Cl. .................................. 29/604; 29/737; 340/174 MA
[51] Int. Cl.² ........................................ H01F 41/08
[58] Field of Search ............ 29/604, 602, 433, 241, 29/203 MM, 605; 340/174 MA

[56] References Cited
UNITED STATES PATENTS

| | | | |
|---|---|---|---|
| 3,589,002 | 6/1971 | Swenson | 29/604 |
| 3,875,639 | 4/1975 | Burkin et al. | 29/604 X |

Primary Examiner—Carl E. Hall
Attorney, Agent, or Firm—Holman & Stern

[57] ABSTRACT

A method of making a memory plane of a magnetic decoder comprising threading of transformers of a decoder memory plane by a single wire by means of stringing ferrite cores in a column on a wire which will serve as a bias winding of all transformers, and then arranging the transformers in a specified configuration to form a row extending in one coordinate direction, and threading primary windings of all transformers in one row by a single wire. Several rows are subsequently arranged in a strip of transformers which is threaded by a third wire in a second coordinate direction, and secondary windings are wound for each transformer separately.

1 Claim, 10 Drawing Figures

METHOD FOR MAKING MEMORY PLANE FOR MAGNETIC DECODER

The present invention relates to the manufacture of elements to be employed in electronic computers and more particularly to methods and devices for making a memory plane for a magnetic decoder. It can be used for making memory storage units for computers, logical automata, communication equipment and control systems.

Devices for making memory planes for magnetic decoders are known in prior art. In a known memory plane of a magnetic decoder, primary windings along two coordinate axes, drive windings and single-turn bias windings are threaded through only one transformer core or a small group of transformers, after which, for example, the single-turn bias windings of all the transformers are connected in series, i.e. soldered together, while individual fragments of the primary windings are also soldered together for all the transformers of each coordinate strip both in the X and Y directions. Since soldering on a matrix field is not permitted and can be made only to terminal lugs disposed on the matrix frame, the matrix of a known magnetic decoder is extremely complicated even for low-capacity memory storage units.

The disadvantages of this known method of making memory planes of a magnetic decoder are a large number of soldered connections, complexity of winding transformers and their assembling into a matrix which renders it unfeasible to make decoder memory planes for superhigh-capacity memory storage units and results in low operation efficiency and insufficient performance reliability of a magnetic decoder.

Customarily transformers used in storage stacks of up-to-date computers are wound manually. This simple operation is accomplished as follows: first, if the core of a transformer consists of several ferrite rings, a required number of the rings are fastened together in the form of a tube, and then several turns of the X and Y windings, a single-turn bias winding and an output winding are threaded through these rings by hand using wire sections. The same procedure is employed for making a gang of several interconnected transformers. Several cores are held in the left hand, the apertures of the cores are threaded by the end of a wire section held in the right hand and the resulting winding turns are sequentially tightened.

Machines for automatic winding of toroidal transformers with detachable ring shuttles presently in use are not suitable for this operation, because it is a rather difficult to charge them with wire and also because tapping of each transformer winding and fastening terminals becomes more complicated. Therefore, it is still preferable that transformers comprising a large number of windings made of wire of different diameters, several turns (one to three) in each winding, (and decoder transformers are just such transformers) are wound by hand.

The drawbacks encountered in manual winding of transformers are a low operating efficiency and inconvenience of winding which are mainly due to the difficulty of holding several transformer cores in the left hand.

It is an object of the invention to provide an improved method of making a memory plane of a magnetic decoder wherein the number of soldered connections in a memory plane is reduced.

It is a further object of the invention to provide a simpler method of making a memory plane of a magnetic decoder.

It is a still further object of the invention to increase the storage capacity of a memory plane of a magnetic decoder.

It is an object of this invention to minimize the amount of manual labour in making memory planes of a magnetic decoder.

It is still another object of this invention to improve the operation reliability of a magnetic decoder.

With these and other objects in view, the invention resides in threading memory plane transformers by a single bias winding wire common for all the transformers, and single X and Y drive winding wires for each strip of the memory plane. To do this, all the transformer cores required for wiring the entire memory plane are first strung by a single bias winding wire long enough to thread these windings in all the transformers of the memory plane, then cores necessary for two transformers are separated from other strung cores, the wire is bent at the midpoint between these separated cores, and the cores of the two transformers are threaded by at least one turn of the drive wire, for example, an X drive wire. Further, each subsequent pair of the cores strung by a bias winding wire curved as a zigzag line is threaded by the continuation of the X drive wire from the first pair of transformers and so on until one X row is completed. Then all subsequent X rows of the memory plane are threaded by the same X drive wire so as to form a continuous strip, the strip of transformers is bent, also in a zigzag manner, at break points of the X axes and single wires are drawn through the cores of the memory plane in the Y direction, thus forming Y rows transverse to the X rows. After that an individual secondary winding is threaded through each core of memory plane transformers.

Such a memory plane of a magnetic decoder has no soldered connections between transformer windings, is compact and does not need additional fastening. Its wiring is simple as compared with conventional memory planes which increases the reliability of the decoder in a memory storage unit, cuts down its cost and raises its making efficiency.

Also according to the present invention, there is provided a device for simplifying to some extent simultaneous winding of several transformers and increasing the efficiency of manual winding which comprises a rotatable wheel with hollows along its periphery configured to receive transformer cores. Concentrically with this wheel is rigidly fastened a fixing plate in the form of an arc over a part of the wheel circumference. The radius of the arc is selected such that a core received in the hollow of the wheel rotates freely with rotation of the wheel and at the same time is reliably fixed in this hollow. Such an arrangement completely obviates the need for a worker to hold cores, provides operation convenience, makes the winding operation easier and raises its efficiency.

Other objects and advantages of this invention will be better understood from a consideration of the description of preferred embodiments thereof when taken in conjunction with the accompanying drawings in which.

A method of making a memory plane of a magnetic decoder comprises threading of transformers of a decoder memory plane by a single continuous wire to provide a bias winding and by X and Y drive wires also continuous for each row.

Figure 1:
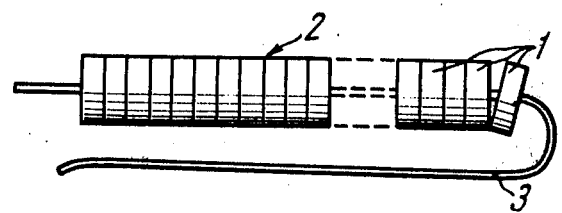
FIG. 1 illustrates ferrite cores strung on a wire in a column.

With this aim in view, cores 1 (FIG. 1) of transformers taken in a quantity sufficient for an entire decoder memory plane are strung in a column 2 by a single wire 3 long enough to make a continuous single-turn bias winding of all transformers of a memory plane. The cores of transformers are ring-shaped toroidal ferrite cores, either one ring per transformer, or a stack of several rings for one transformer of a memory plane of a decoder. The cores 1 can be strung on the wire 3 automatically from a rotating core container (not shown in the drawing) or by hand, the insulation of the wire remaining practically intact in both operations which permits making a continuous bias winding in a memory plane of any storage capacity.

Figure 2:
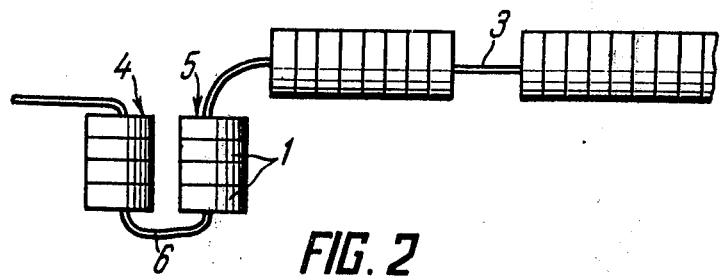
FIG. 2 illustrates cores for two transformers separated from a column of cores.

Then, a number of the cores 1 (FIG. 2) necessary to make two transformers 4 and 5 (eight cores in a preferred embodiment of the invention) is separated from the cores strung on the wire 3 and the wire 3 is folded in two by bending it at a midpoint 6 between the separated cores 1. A preset number of turns is threaded through apertures 7 (FIG. 3) of the cores 1 of these two transformers by a second wire 8 of a primary winding oriented in one direction, for instance, an X winding, the length of the wire 8 being selected so as to enable threading of this primary X winding in all the transformers of one row of a memory plane oriented in the X direction.

Figure 4:
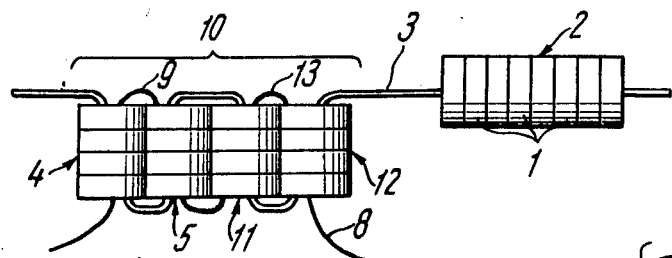
FIG. 4 shows a row of two pairs of transformers.

FIG. 4 shows a row 10 of two pairs of transformers 4, 5 and 11, 12.

Figure 3:
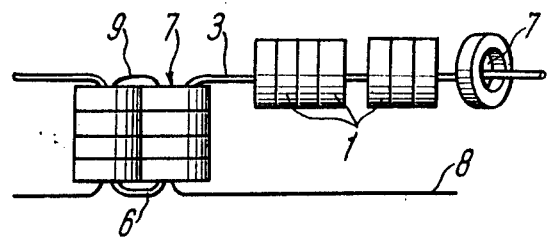
FIG. 3 shows threading of a primary winding oriented in a first direction.

For producing the row 10 several operations required to wind one pair of transformers are repeated, namely: eight cores 1 are again separated from the column 2, the wire 3 strung through the cores is folded in two at the midpoint thus forming two transformers 11 and 12 which comprise a bias winding made of the wire 3 of a continuous length which is a continuation of the bias windings of the transformers 4, 5. Then a primary winding 13 is threaded by the continuation of the wire 8 for a pair of transformers 11 and 12. Several pair of transformers wound in the same way produce the row 10. For the sake of simplification, FIG. 3 shows only two pairs of transformers. The primary windings 4, 5 and 11, 12 of one row 10 are made by one wire 8.

Figure 5:
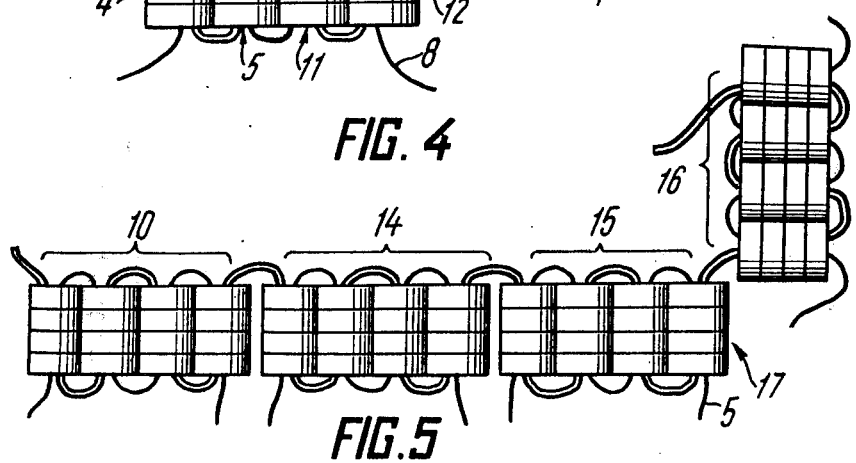
FIG. 5 is an illustration of rows arranged in a strip.

A required number of next rows 14, 15, 16 (FIG. 5) extending in the X direction produced in the same way form a strip 17. The rows 14, 15, 16 are made sequently by one continuous (single) wire 3.

Figure 6:
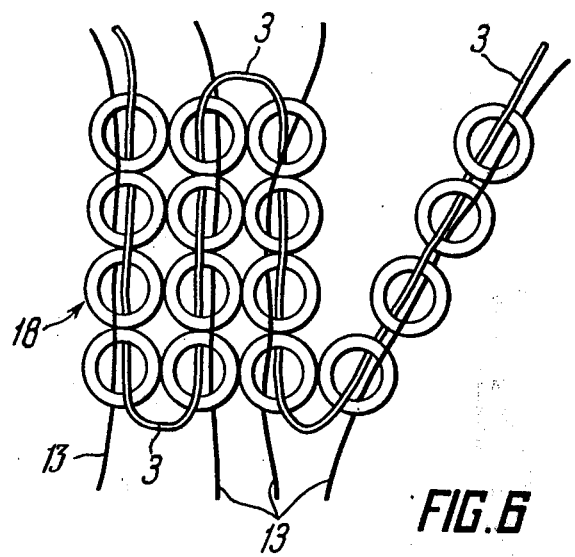
FIG. 6 illustrates strips of transformers curved in a zigzag manner.
Figure 7:
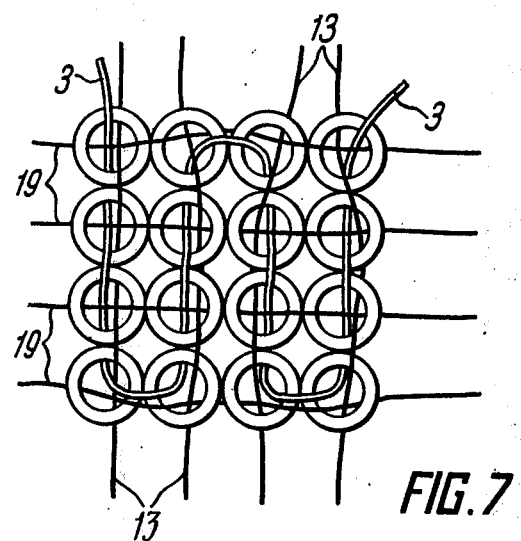
FIG. 7 is a view of the same as shown in FIG. 6 with primary windings oriented in a second direction.

The strip 17 of transformers (FIG. 6) is then curved in a zigzag manner by bending the wire 3 at points between the primary X windings, into a matrix 18 of a magnetic decoder. The resulting memory plane 18 with the windings 13 oriented in one direction only is wired by primary Y windings 19 in a direction transverse to the strips 17 (FIG. 7). The Y windings are threaded similar to the primary windings 13 with a required number of turns per each pair of transformers 11, 20 and also using single wires 21 along enough to make the continuous Y primary winding 19 for all the transformers of a Y row simultaneously.

Figure 8:
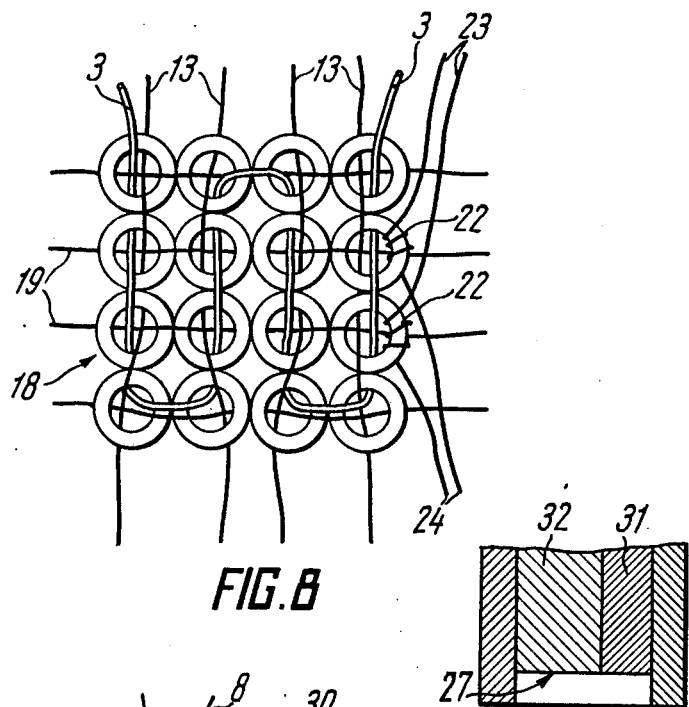
FIG. 8 shows a memory plane of a magnetic decoder as wired by a method and device of the present invention.

Finally, secondary windings 22 are threaded separately through the cores of each transformer of the memory plane 18 (only two transformers are shown in FIG. 8). Ends 23, 24 of the secondary windings 22 are taken outside the memory plane 18.

A memory plane wired by the preferred method comprises bias windings made up of the wire 3 which threads all the cores 1 of the transformers 4, 5, 11, 12, 20 of the entire memory plane 18 of a decoder.

The primary X windings 13 are threaded by at least one turn through each pair of the transformers 4 and 5, 11, and 12, and are also made up of one single wire 8 for each row 10, 14, 15, 16 extending along the X axis. The primary Y windings 19 comprising at least one turn, are threaded through the cores of each pair of the transformers 11, 20 in the direction transverse to the rows 10, 14–16 and are also made by single wires 21 for each row 25 extending along the Y axis.

Figure 9:
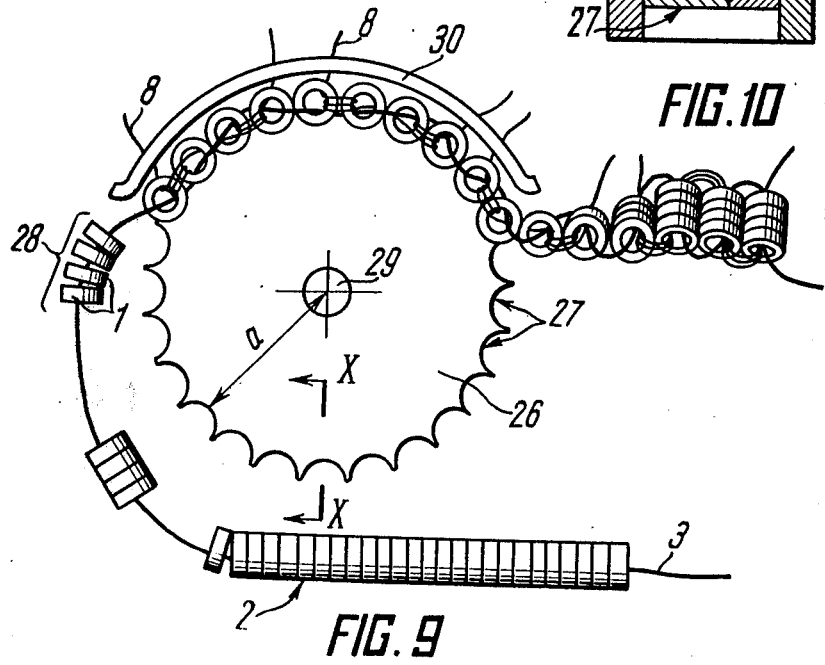
FIG. 9 is a diagrammatic view of a device for carrying out the method according to the present invention.

For making a memory plane of a magnetic decoder by the preferred method, a device shown in FIG. 9 is highly suitable. The device comprises a wheel 26 with hollows 27 along the periphery thereof arranged in the form of teeth of a sprocket (or a gear). Each hollows 27 is configured to precisely fit the shape of the core 1 so that the core 1 or its stack 28 can be easily accommodated therein. The wheel 26 is fitted on a shaft 29 and can rotate about the shaft provided a slight force is applied. One part of the wheel 26, preferably, its upper part, is covered by a fixing plate 30 in such a way that the cores 1 accommodated in the hollows 27 are reliably held therein on the periphery of the wheel 26 covered by the plate 30, for which purpose the plate 30 is arched so that the radius of the arc exceeds the distance $a$ from the bottom of the hollow 27 to the centre of the wheel 26 by the outer diameter of the core 1.

Figure 10:
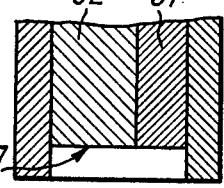
FIG. 10 is a sectional view taken along the line X—X of FIG. 9.

Preferably, the rotatable wheel 26 of the device is assembled of separate disks 31, 32 (FIG. 10) in which case combinations of disks of different thickness can be used to readjust the device for winding different transformers.

Prior to beginning of operation, a sufficient number of the ferrite cores 1 are strung on the wire 3 in the column 2 which substitutes completion of a single-turn bias winding on the transformers. Then, a certain number of the cores 1 required for one transformer is separated from the other cores on the wire 3, this set of cores 28 is placed into the hollow 27 of the wheel 26 adjacent to the fixing plate 30, and the wheel 26 is rotated so that the cores 1 on the wire 3 are drawn under the plate 30 and are fixed stationary therein. Then, the next set of the cores 1 for a second transformer is separated on the continuation of the wire 3, the wire 3 is bent so as to thread this set in a direction opposite to the direction of the wire in the previous set of cores, and the set of cores is placed in the wheel 26 into the hollow 27 adjacent to the hollow into which the previous set of cores was placed, close to the plate 30. The wheel 26 is rotated as previously to fix in place the cores, and the wire 3 is subjected to a pulling force so that it is closely tightened in the apertures 7 of the cores 1. Thus transformers with a single-turn winding, for example, a bias winding, are wound in a space between the wheel 26 and the plate 30.

The primary winding 9 of the transformers is wired while the cores are placed in the hollows of a part of the wheel 26 fixed by the plate 30. It is advantageous that this winding is started from the middle transformers in a row of transformers encompassed by one such winding, and continued towards the outside transformers. Therefore, the number of the hollows 27 in a part of the wheel 26 under the fixing plate 30 must be somewhat larger than the number of transformers in a half row with the winding 9. After completing a single-turn winding for transformers sufficient for one half of a row, the winding 9 is threaded starting from the middle of a wire section intended for this winding and from the last pair of the cores that have been fixed immediately before that, namely, the end cores on the wire 3. Only after this half of the winding 9 is completed in the row of transformers, the next sets 28 of the cores 1 are separated on the wire 3 and drawn under the fixing plate 30 and each pair of the cores is simultaneously threaded by the winding 9 made from the second half of the wire 8 intended to complete this winding. This method helps avoid damage to the insulation of the wire 8 of the winding 9, since this wire is passed through one half of the row of transformers rather than through the entire row. The operation of winding is also somewhat facilitated because relatively short wire sections are employed for winding.

A strip of transformers with two windings made by the preferred method is bent in a zigzag manner at points between the windings 9 and is aranged in matrix configuration according to the preferred method and the manufacture of a memory plane is continued.

The proposed way of making a memory plane of a magnetic decoder and a device therefor make it possible to considerably simplify the manufature of storage memory units with decoders, cut down their cost and increase the performance reliability of decoders through reducing the number of soldered connections.

What is claimed is:

1. A method of making a memory plane of a magnetic decoder comprising the steps of:

taking toroidal ferrite cores in a quantity sufficient for wiring the entire memory plane;

stringing said ferrite cores in a column on a wire which forms a bias winding of each transformer and is long enough to complete bias windings of all the transformers of a memory plane;

separating a number of ferrite cores required for winding two transformers one by one from said column of cores;

bending said wire threading the separated cores at a midpoint and folding it in two;

threading a primary winding oriented in a first direction simultaneously for two transformers by a second wire which is long enough to complete all primary windings in one row of transformers extending in the first direction;

making a primary winding oriented in the first direction for the next pairs of transformers using said second wire in the same manner;

and producing a row of a specified length extending in the first direction out of these pairs of transformers;

threading in the same way the primary row of the first direction through the cores of transformers of the next row and the entire number of rows extending in the first direction to form a strip of transformers;

bending said strip of transformers in a zigzag manner at points between primary windings oriented in the first direction so as to form a memory plane of a decoder;

threading pairs of transformers by a third wire in a direction transverse to said strips of transformers producing thereby primary windings oriented in the second direction;

the third wire being long enough to complete all the primary windings of all the transformers oriented in the second direction;

making secondary windings for each transformer separately and taking the ends of said windings outside a memory plane.

* * * * *